United States Patent [19]

Turowski

[11] 4,454,380

[45] Jun. 12, 1984

[54] STABILIZED MULTIFILAMENT SUPERCONDUCTOR MADE OF BRITTLE, PREREACTED NB3SN FILAMENTS IN A BRONZE MATRIX

[75] Inventor: Peter Turowski, Eggenstein-Leopoldshafen, Fed. Rep. of Germany

[73] Assignee: Kernforschungszentrum Karlsruhe GmbH, Fed. Rep. of Germany

[21] Appl. No.: 362,891

[22] Filed: Mar. 26, 1982

[30] Foreign Application Priority Data

Mar. 28, 1981 [DE] Fed. Rep. of Germany ....... 3112372

[51] Int. Cl.³ ...................... H01B 12/00; H01L 39/24
[52] U.S. Cl. .................................. 174/128 S; 29/599; 174/15 S; 174/126 S
[58] Field of Search ............... 174/15 S, 126 S, 128 S; 29/599

[56] References Cited

U.S. PATENT DOCUMENTS

| | | | |
|---|---|---|---|
| 3,643,001 | 2/1972 | Schaetti | 174/15 S |
| 3,767,842 | 10/1973 | Bronca et a. | 174/128 S |
| 4,028,488 | 6/1977 | McDougall | 174/128 S |
| 4,079,187 | 3/1978 | Fillunger et al. | 174/128 S X |
| 4,169,964 | 10/1979 | Horvath et al. | 174/128 S X |
| 4,242,536 | 12/1980 | Young | 174/128 S |
| 4,254,299 | 3/1981 | Horvath et al. | 174/128 S X |
| 4,333,228 | 6/1982 | Koch | 174/15 S X |

OTHER PUBLICATIONS

Kuckuck, H. et al., "Magnet Coil Tests with Multiple Soldered Niobium-Tin Filament Conductors"; Cryogenics; Jun. 76, ; pp. 350-354.

Primary Examiner—J. V. Truhe
Assistant Examiner—Morris H. Nimmo
Attorney, Agent, or Firm—Sughrue, Mion, Zinn, Macpeak and Seas

[57] ABSTRACT

Multifilament superconductors of brittle, prereacted Nb3Sn filaments in a bronze matrix wherein the electrical power under superconductive conditions is stabilized. The superconductor comprises a core of Nb3Sn multifilaments and a bridge containing a band of purest aluminum which is soldered in parallel to the superconductor core.

13 Claims, 6 Drawing Figures

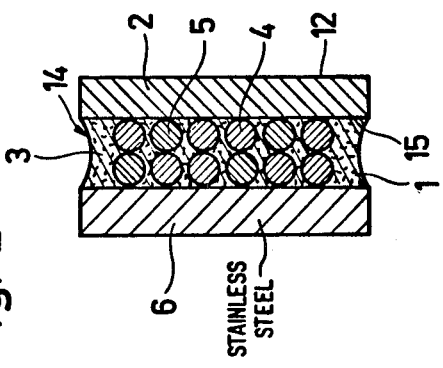
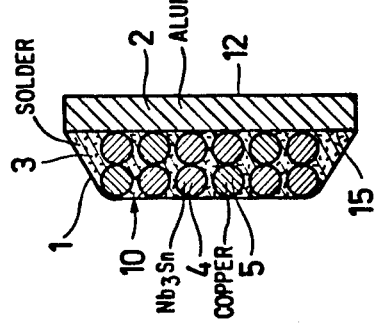
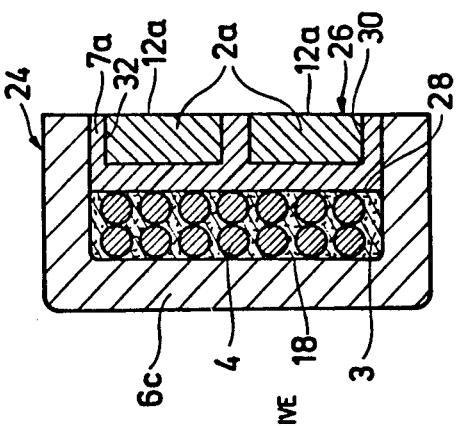
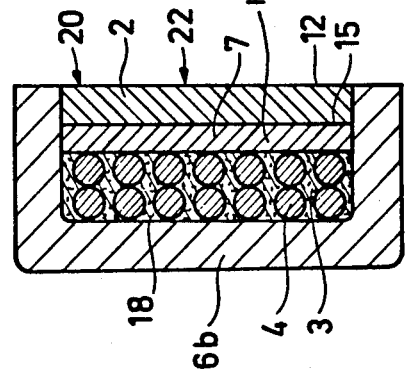
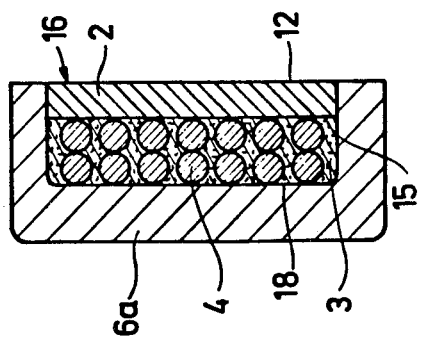

STABILIZED MULTIFILAMENT SUPERCONDUCTOR MADE OF BRITTLE, PREREACTED NB3SN FILAMENTS IN A BRONZE MATRIX

BACKGROUND OF THE PRESENT INVENTION

The present invention relates to multifilament superconductors whose electrical performance under superconductive conditions has been stabilized and which are made of brittle, prereacted Nb3Sn filaments in a bronze matrix and to a process for producing such stabilized multifilament superconductors.

The use of prereacted Nb3Sn/bronze multifilament superconductors in the construction of high field magnets is fraught with uncertainties since the known brittleness of Nb3Sn/bronze conductors may produce inadvertent defects in the conductor when it is produced and also while the magnet is being constructed. These defects then bring about a reduced current carrying capability of the conductor and thus reduced power of the constructed magnets. Without discussing the particular problem of possible defects in the conductor, at present it is exclusively copper which is integrated in the conductor for stabilization purposes with the superconductive multifilaments occupying a cross-sectional area up to 60% of the conductor and the copper occupying a cross-sectional area of at least 40% of the conductor. In special conductor designs, copper profiles are soldered on so as to produce larger copper area proportions. See, for example, H. Kuckuck, E. Springer and G. Ziegler, CRYOGENICS, June 1976, pages 350 to 354.

Due to the high magnetoresistance of copper, the required copper area proportion is large. This results in a reduction of current density. Therefore, it becomes almost impossible to accommodate a steel armor in the conductor. Accordingly, if copper is used for stabilization, it must further serve as an armor or force carrying element and therefore must be in a semihard state.

SUMMARY OF THE PRESENT INVENTION

It is an the object of the present invention to provide a composite superconductor comprised of prereacted Nb3Sn multifilaments which, despite certain known drawbacks of bronze type conductors, in particular the formation of defects in the Nb3Sn multifilaments, permits reliable operation of high field magnets in the intended field range.

A further object of the present invention is to provide such a superconductor which is electrically stabilized so that no degradation will occur in the conductor which would lead to premature transition to normal conduction and thus to reduced power in the magnet.

Additional objects and advantages of the present invention will be set forth in part in the description which follows and in part will be obvious from the description or can be learned by practice of the invention. The objects and advantages are achieved by means of the products, processes, instrumentalities and combinations particularly pointed out in the appended claims.

To achieve the foregoing objects and in accordance with its purpose, the present invention provides a stabilized multifilament superconductor of brittle, prereacted Nb3Sn filaments in a bronze matrix, comprising a superconductor core of Nb3Sn filaments and a bridge which is soldered in parallel to the superconductor core and which contains a band of purest aluminum.

The superconductor of the present invention can be provided with a metallic armor likewise soldered to the superconductor core or can be produced without the metallic armor. In one preferred embodiment of a superconductor with armor, the armor is made of stainless steel and at least part of the residual surface of the band of purest aluminum remaining after soldering is exposed for the access of a coolant.

In a further advantageous embodiment of the present invention, the bridge further comprises a layer of a highly resistive metal, preferably of brass, Cu-Zr, Cu-Be or stainless steel, between the Nb3Sn conductor core and the band of purest aluminum. The highly resistive metal layer preferably has a thickness of a few tenths of a millimeter.

In another aspect of the present invention, there is provided a process for producing such stabilized multifilament superconductors which comprises soft soldering to a Nb3Sn superconductor core, at least on one side of the core, a bridge containing a band of purest aluminum.

In a preferred embodiment of the process of the present invention, a metallic armor is soft soldered to the Nb3Sn conductor. Preferably, stainless steel is used as the metallic armor, and the armor is soldered to the Nb3Sn conductor in such a manner that at least part of the residual surface of the band of purest aluminum remaining after soldering is exposed for the access of a coolant.

In a still further preferred embodiment according to the process of the present invention, in order to suppress eddy currents, the bridge comprises a layer of highly resistive metal between the Nb3Sn conductor and the band of purest aluminum to act as a resistance barrier, and the soldering of the bridge to the superconductor core comprises soldering the layer of highly resistive metal to the superconductor core. The highly resistive metal layer preferably has a thickness of a few tenths of a millimeter, for example 0.2 to 0.7 mm. The highly resistive metal employed is preferably at least one species from the group of brass, Cu-Zr, Cu-Be, and stainless steel. The soft solder employed preferably is a metal alloy having a melting point between about 200° C. and 250° C., for example, a tin-lead solder.

It is to be understood that both the foregoing general description and the following detailed description are exemplary, but are not restrictive of the invention.

BRIEF DESCRIPTION OF THE DRAWINGS

The accompanying drawings, in which like numbers indicate like parts, illustrate examples of presently preferred embodiments of the invention and, together with the description, serve to explain the principles of the invention.

FIG. 1 is a cross-sectional view, taken perpendicular to the longitudinal axis of the multifilaments, of one embodiment of a superconductor produced in accordance with the teachings of the present invention.

FIG. 2 is a similar cross-sectional view of another embodiment of a superconductor produced in accordance with the teachings of the present invention.

FIG. 3 is a similar cross-sectional view of another embodiment of a superconductor produced in accordance with the teachings of the present invention.

FIG. 4 is a similar cross-sectional view of another embodiment of a superconductor produced in accordance with the teachings of the present invention.

FIG. 5 is a similar cross-sectional view of another embodiment of a superconductor produced in accordance with the teachings of the present invention.

DETAILED DESCRIPTION OF THE PRESENT INVENTION

Figure 1A:
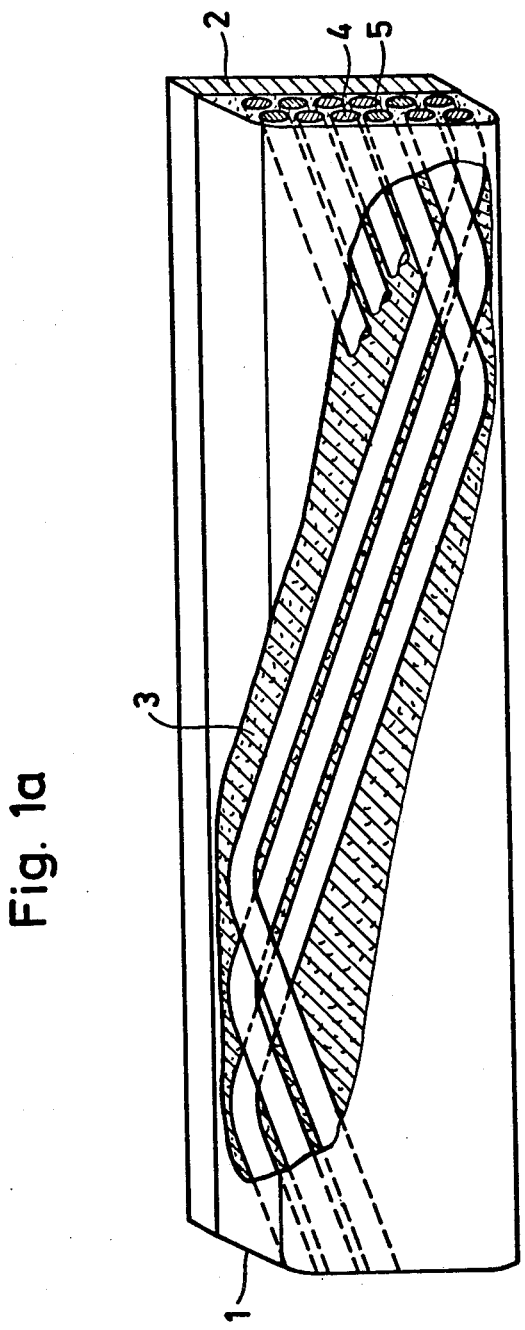
FIG. 1a is a perspective view of a multifilament superconductor corresponding to FIG. 1.

The present invention provides a composite superconductor which contains a core of prereacted Nb3Sn/bronze multifilaments and a bridge which is soldered in parallel to the core and which contains a band of purest aluminum. The superconductor core used in the present invention can comprise a plurality of Nb3Sn/bronze multifilaments only. In the manufacture of known superconductors of the Nb3Sn/bronze type, copper wires are often incorporated in the superconductor. The superconductor core employed in the present invention similarly can contain such copper wires. Thus, the effect of the present invention is also observed if a bridge containing a band of purest aluminum is soldered to a superconductor core manufactured in this manner.

The bridge can comprise a band of purest aluminum soldered directly to the superconductor core. Alternatively, the bridge can comprise a layer of highly resistive metal in contact with the superconductor core and a band of purest aluminum, with the highly resistive layer being between the superconductor core and the band of purest aluminum, and being soldered to the superconductor core. The band of purest aluminum can be secured to the layer of highly resistive metal by soldering.

The highly resistive metal layer provides a resistance barrier to reduce eddy currents between the superconductor core and the aluminum band. The layer of highly resistive metal can have a profile having suitable dimensions and one or more aluminum bands can be embedded in the profile. The bridge generally extends the full length of the core.

The band of purest aluminum must have a resistivity ratio in the range between 500 and 2000. It can be made of aluminum of RRR 1800 quality. The term aluminum of RRR 1800 quality refers to purest aluminum having a resistance value of $$\frac{\rho\delta(300° K.)}{\rho\delta(4.2° K.)} = 1800.$$

The parallel soldering of a bridge containing a band of highly pure aluminum to the multifilaments provides a good normally conductive bridge over any resulting defects in the conductor so that the feared degradation in the superconductor does not occur. Magnets produced from superconductors made in accordance with the present invention exhibit stabilized electrical power under superconductive conditions. There is no premature transition to normal (conductive operation) and thus no reduced power in the magnet.

A superconductor produced in accordance with the present invention and containing a band of aluminum of RRR 1800 quality and a cross-sectional area proportion of Al/Nb3Sn-bronze in the range between 1 and 2, and in the tested case of 1.33 provided a bridge for damage amounting to 80% of the superconductor at one location thereof without impairing the current carrying capability. The term "damage amounting to 80% of the superconductor" refers to a damage which in the curve of current values in dependence on voltage shows loss of superconduction already at 20% of the critical current value of $I_c$ of the undamaged conductor. Another composite superconductor produced in accordance with the present invention and having a brass resistance barrier of a thickness of a few 0.1 mm between the Nb3Sn-bronze and the Al yielded similarly good results.

The soldering of the aluminum band, the arming of the superconductor with a metal armor, or the soldering of intermediate highly resistive metal barrier layers can be effected by a usable, known, commercially available fluxing agent (for example Aludeen (trade name) type F-LW 2, Deutsche Industrienorm No. 8511, of the manufacturer CHEMET GmbH, 5432 Wirges, FRG). Soldering a bridge containing a band of the purest aluminum enables the full operating current to be obtained in the superconductor, with appropriate cooling, even if there is a defect in the superconductor, which is not the case without aluminum.

The present invention will now be explained in greater detail with the aid of a few embodiments of stabilized multifilament superconductors illustrated in the drawings.

Referring now to FIG. 1, there is shown a cross section of a superconductor, generally 10, comprised of a core 1 of Nb3Sn/bronze multifilament wires 4 and copper wires 5. Wires 4 and wires 5 are arranged in a flat cable configuration and are transposed with a twist pitch which is given by the requirements of the user. An example of the cable configuration is given in FIG. 1a (corresponding to FIG. 1). A band 2 of purest aluminum has a planar surface 15 and is soldered in parallel to core 1 on one side of the core, with the aid of an Sn-Pb solder 3 which provides a solder matrix for core 1. The parallel soldering of band 2 refers to the fact that its planar surface 15 is parallel to the planar surface of the flat cable configuration. As seen in FIG. 1, band 2 is in direct contact with core 1, and is generally coextensive with one side of the core. Band 2 generally extends the full length of core 1. Band 2 has a side 12 which is exposed for access of a coolant.

Turning now to FIG. 2, there is shown a cross section of another embodiment of the present invention comprised of a superconductor 14 which has a similar design as the superconductor 10 of FIG. 1. Thus, superconductor 14 is made of core 1 of Nb3Sn/bronze wires 4 and copper wires 5 which are arranged to provide a generally flat or rectangular cross-section for core 1, and a band 2 of purest aluminum which has been soldered in parallel to one side of the core by an Sn-Pb solder. On the side opposite aluminum band 2, a band 6 of stainless steel is likewise soldered onto core 1 and serves as an armor for the superconductor. Band 6 is generally coextensive with the side of core 1 that it contacts, and generally extends the full length of core 1.

A further embodiment of the present invention is disclosed in FIG. 3. As shown in FIG. 3, a superconductor (in a cross section), generally 16, comprises a superconductor core 18 made exclusively of Nb3-Sn-bronze wires 4, onto which a band 2 of purest aluminum has been soldered by means of a tin-lead solder 3. Superconductor core 18 is soldered together with aluminum band 2, into a metal armor in the form of a stainless steel profile 6a which generally extends the length of core 18. Profile 6a has a U-shaped cross section, with core 18 and band 2 being located in profile 6a in such a manner that core 2 contacts and is surrounded by profile 6a and that part of the surface of the band of purest aluminum remains uncovered and is thus accessible to cooling. The uncovered surface accessible to cooling is shown by reference numeral 12 in FIG. 3.

Turning now to FIG. 4, there is shown a superconductor 20 made in accordance with one embodiment of the present invention and containing a superconductor core 18 made exclusively of Nb$_3$Sn/bronze wires 4. A bridge, generally 22, is soldered in parallel to core 18 and comprises a layer 7 of a highly resistive metal in direct contact with core 18 and a band 2 of purest aluminum, with metal layer 7 being between core 18 and band 2. Metal layer 7 is made of brass. A metallic armor in the form of a U-shaped profile 6b is provided, with core 18 being soldered into profile 6b, and with surface 12 of band 2 being exposed for access of a coolant. The embodiment of FIG. 4 thus differs from that of FIG. 3 only in that between core 18 of the superconductor and aluminum band 2, there is soldered a layer of a highly resistive metal 7, in this case, brass.

Referring now to FIG. 5, there is shown a superconductor 24 which contains a superconductor core 18 made exclusively of Nb$_3$Sn/bronze wires 4. A bridge, generally 26, is soldered in parallel to core 18 and comprises a profiled layer 7a of a highly resistive metal in direct contact with core 18 and two bands 2a of purest aluminum. Profile layer 7a contains a planar surface 28 which is parallel to the planar surface of the flat cable configuration and two channels 30 and 32 which are opposite planar surface 28. A band 2a is positioned in each channel. A metallic armor in the form of a U-shaped profile 6c is provided, with core 18 being soldered into profile 6c, and with surface 12a of each band 2a being exposed for access of a coolant.

FIG. 5 thus shows a superconductor in which not only stainless steel portion 6c but also resistive metal 7a has a profile shape. This makes it necessary to solder aluminum band 2a into the profile of resistive metal 7a.

It will be understood that the above description of the present invention is susceptible to various modification, changes and adaptations, and the same are intended to be comprehended within the meaning and range of equivalents of the appended claims.

What is claimed is:

1. A stabilized multifilament superconductor of brittle, prereacted Nb$_3$Sn filaments in a bronze matrix with the electrical performance of said superconductor, under superconductive conditions, being stabilized, comprising a superconductor core containing the prereacted Nb$_3$Sn filaments in a bronze matrix and a bridge soldered in parallel to the superconductor core and containing a band of purest aluminum, the solder being a soft solder which is a metal alloy having a melting point between 200° C. and 250° C., and said bridge containing a layer of highly resistive metal between the superconductor core and the band of purest aluminum.

2. The stabilized multifilament superconductor as defined in claim 1, and further comprising a metallic armor soldered to the superconductor core.

3. Stabilized multifilament superconductor as defined in claim 1, wherein the armor is made of stainless steel and at least part of the surface of the band of purest aluminum is exposed for the access of a coolant.

4. Stabilized multifilament as defined in claim 1, wherein the band of purest aluminum is soldered to the layer of highly resistive metal.

5. Stabilized multifilaments superconductor as defined in claim 1, wherein said layer of highly resistive metal has a thickness of a few tenths of a millimeter.

6. Stabilized multifilament superconductor as defined in claim 1 or 5, wherein the highly resistive metal is brass, Cu-Zr, Cu-Be or stainless steel.

7. Method for producing a multifilament superconductor of brittle, prereacted Nb$_3$Sn filaments in a bronze matrix, with the electrical performance of said superconductor under superconductive conditions, being stabilized, comprising providing a superconductor core containing prereacted Nb$_3$Sn filaments in a bronze matrix, and soft soldering a bridge containing a band of purest aluminum to at least one side of the superconductor core, the soft solder being a metal alloy having a melting point between about 200° C. and 250° C., wherein in order to suppress eddy currents, the bridge further comprises a layer of highly resistive metal between the superconductor core and the band of purest aluminum to serve as a resistance barrier, and the soldering of the bridge comprises soldering the layer of highly resistive metal to the superconductor core.

8. Method as defined in claim 7, and further comprising soldering a metallic armor to the superconductor core.

9. Method as defined in claim 8, wherein stainless steel is used as the metallic armor, and the armor is soldered to the superconductor core so as to expose at least part of a surface of the band of purest aluminum.

10. Method as defined in claim 7, wherein the band of purest aluminum is soldered to the layer of highly resistive metal.

11. Method as defined in claim 7, wherein the soldering of the layer of highly resistive metal comprises soldering a layer of highly resistive metal which has a thickness of a few tenths of a millimeter.

12. Method as defined in claim 7, wherein at least one species from the group of brass, Cu-Zr, Cu-Be, and stainless steel is used as the highly resistive metal layer.

13. Method as defined in claim 7, wherein a tin-lead solder is used as the soft solder.

* * * * *